United States Patent
Miyajima et al.

[19]

[11] Patent Number: 6,133,120
[45] Date of Patent: *Oct. 17, 2000

[54] BORON-DOPED P-TYPE SINGLE CRYSTAL SILICON CARBIDE SEMICONDUCTOR AND PROCESS FOR PREPARING SAME

[75] Inventors: Takeshi Miyajima, Kariya; Norihito Tokura, Okazaki; Atsuo Fukumoto, Aichi; Hidemitsu Hayashi, Owariasahi, all of Japan

[73] Assignee: Nippondenso Co., Ltd., Kariya, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/704,820

[22] Filed: Aug. 28, 1996

[30] Foreign Application Priority Data

Aug. 28, 1995 [JP] Japan .................................. 7-219255

[51] Int. Cl.$^7$ ............................ H01L 21/20; C01B 31/36
[52] U.S. Cl. ........................ 438/478; 438/542; 438/931; 423/345; 423/346
[58] Field of Search .................................. 438/931, 478, 438/495, 483, 542, 268; 423/345, 346

[56] References Cited

U.S. PATENT DOCUMENTS

| | | |
|---|---|---|
| 5,135,885 | 8/1992 | Furukawa et al. . |
| 5,366,713 | 11/1994 | Sichanugrist et al. .................. 438/483 |
| 5,384,270 | 1/1995 | Ueno ...................................... 438/268 |
| 5,463,978 | 11/1995 | Larkin et al. . |
| 5,709,745 | 1/1998 | Larkin et al. . |

FOREIGN PATENT DOCUMENTS

| | | |
|---|---|---|
| 2-049422 | 2/1990 | Japan . |
| 2-253622 | 10/1990 | Japan . |
| 7-106265 | 4/1995 | Japan . |

OTHER PUBLICATIONS

Rao et al: "Al and B ion–implantations in gH– and 3C–SiC", J. Appln. Phys. 77 (6), Mar. 15, 1995, pp. 2479–2485.
Bishop et al: "Donor Indentification in Thin Film Cubic SiC", Springer Proceedings in Physics, Amorphous and Crystalline Silicon Carbide, vol. 34, 1989, pp. 90–99.
Freitas et al: "Spectoscopic Studies of Donors in 3C–SiC Films", Springer Proceedings in Physics, Amorphous and Crystalline Silicon Carbide III, vol. 56, 1992, pp. 135–143.
J. S. Blakemore, Solid State Physics, Cambridge University Press, pp. 74–76 (no month given), 1985.
C. Kittel, Introduction to Solid State Physics, John Wiley & Sons, p. 515 (no month given), 1986.
S. Murarka et al., Electronic Materials, Academic Press, p. 149 (no month given), 1989.
K. Boer, Survey of Semiconductor Physics, Van Nostrand Reinhold, p. 56 (no month given), 1990.

*Primary Examiner*—Charles Bowers
*Assistant Examiner*—Keith Christianson
*Attorney, Agent, or Firm*—Pillsbury Madison & Sutro LLP

[57] ABSTRACT

A p-type silicon carbide semiconductor having a high carrier concentration and activation rate is provided by doping boron as an acceptor impurity in a single crystal silicon carbide. The boron occupies silicon sites in a crystal lattice of the single crystal silicon carbide.

16 Claims, 14 Drawing Sheets

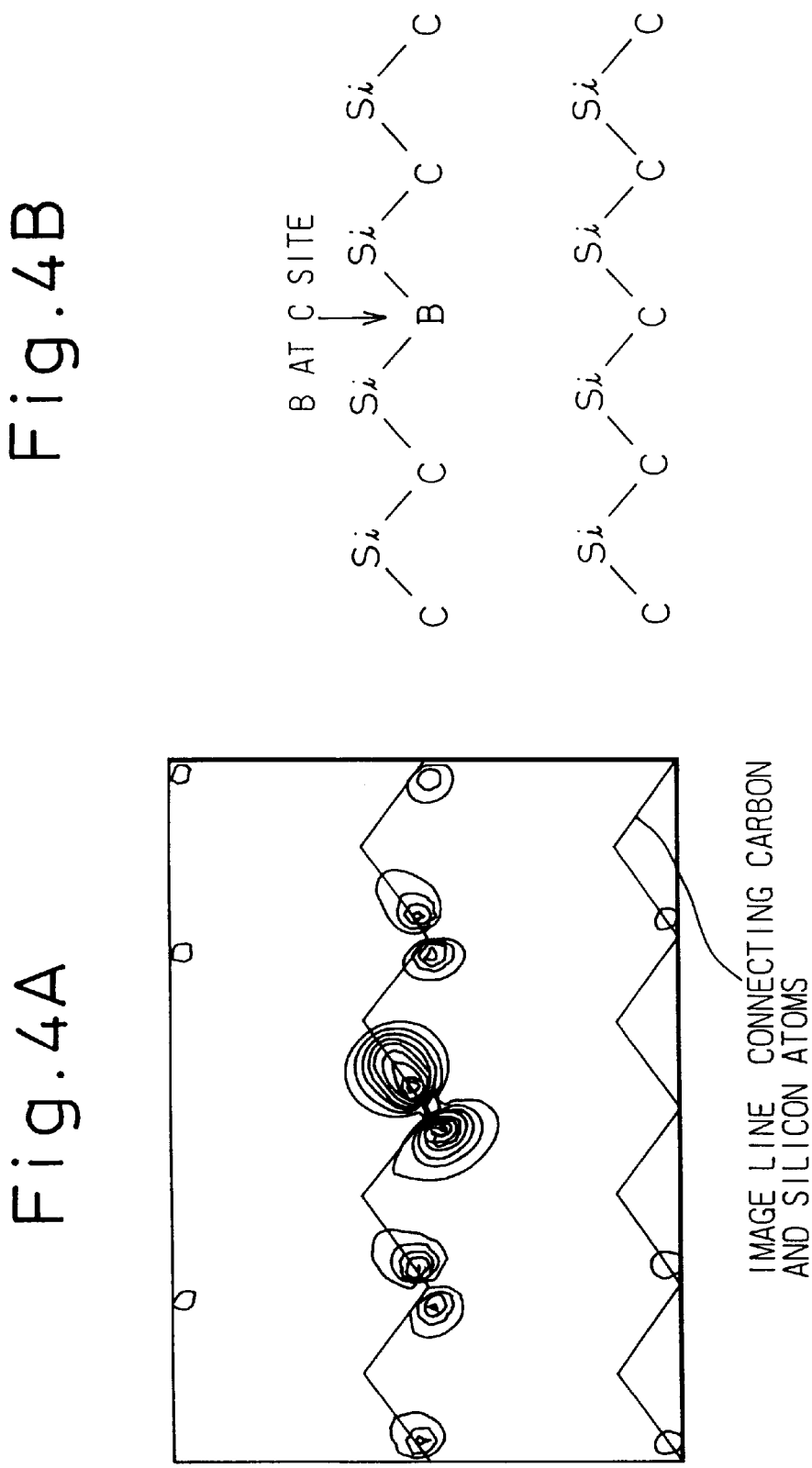

BORON-DOPED P-TYPE SINGLE CRYSTAL SILICON CARBIDE SEMICONDUCTOR AND PROCESS FOR PREPARING SAME

BACKGROUND OF THE INVENTION

1. Field of the Invention

The present invention relates to a boron doped p-type single crystal silicon carbide semiconductor and a process for preparing the same.

2. Descriptions of the Related Art

Doping boron, a III-group element, as an acceptor has been done in an attempt to form a p-type silicon carbide semiconductor. Specifically, boron is added during crystal growth of silicon carbide or boron is introduced in a single crystal silicon carbide by ion implantation, to obtain a p-type single crystal silicon carbide semiconductor.

Nevertheless, it was difficult to obtain a p-type silicon carbide semiconductor having a high carrier concentration and a high activation rate (see, for example, M. V. Rao et al.: Journal of Applied Physics Vol. 77, No. 6 (1995) p.2479). The reasons reported for this difficulty are: that the acceptor level of boron doped in silicon carbide is as deep as 735 meV based on the filled band (S. G. Bishop et al.: Amorphous and Crystalline Silicon Carbide edited by G. L. Haris et al., Springer-Verlag Berlin Heidelberg (1989) p.90), that the site of boron doped in silicon carbide is the site of carbon in a non-doped silicon carbide, i.e., the so-called carbon site (J. A. Freitas et al.: Amorphous and Crystalline Silicon Carbide edited by G. L. Haris et al., Springer-Verlag Berlin Heidelberg (1992) p.135), and so on.

Methods and procedures for controlling the carrier concentration in a boron-doped p-type silicon carbide are not known.

The object of the present invention is to increase the carrier concentration and the activation rate of a boron-doped p-type silicon carbide semiconductor.

SUMMARY OF THE INVENTION

In accordance with one aspect of the present invention, there is provided a p-type silicon carbide semiconductor in which boron is doped as an acceptor impurity in single crystal silicon carbide. The p-type silicon carbide semiconductor being carbon rich, and the boron occupying silicon site in the crystal lattice of the crystal silicon carbide.

Since the silicon carbide is carbon rich, i.e., the number of carbon atoms is larger than that of the silicon atoms in the silicon carbide, the boron can be present at the silicon site and, as a result, the acceptor level becomes shallower than when the silicon carbide is silicon rich and the carrier concentration and activation rate are improved.

In accordance with another aspect of the present invention, the semiconductor above is made by satisfying $1 < d_c/d_{si} \leq 32/31$ where $d_c$ is an atomic density of carbon and $d_{si}$ is an atomic density of silicon.

In accordance with another aspect of the present invention, some of silicon sites in the crystal lattice of the single crystal silicon carbide are vacant. As a result, boron can be present at the silicon sites and the acceptor level becomes shallower than when the silicon carbide is silicon rich and the carrier concentration and activation rate are improved.

In accordance with another aspect of the present invention, some of the silicon sites in crystal lattice of the silicon carbide are occupied by carbon atoms. As a result, boron can be present at the silicon sites and the acceptor level becomes shallower than when the silicon carbide is silicon rich and the carrier concentration and activation rate are improved.

In accordance with another aspect of the present invention, $(d_c - d_{si}) \geq d_B$ is satisfied where $d_c$ is an atomic density of carbon, $d_{si}$ is an atomic density of silicon and $d_B$ is an atomic density of boron. As a result, the silicon carbide becomes carbon rich and the boron can be present at the silicon sites. The acceptor level becomes shallower than when the silicon carbide is silicon rich and the carrier concentration and activation rate are improved.

In accordance with another aspect of the present invention, there is provided a process for preparing a p-type silicon carbide semiconductor, comprising simultaneously supplying a gas containing carbon and silicon and a gas containing boron over a single crystal silicon carbide substrate to grow a p-type silicon carbide semiconductor on the substrate by vapor deposition. A relationship $1 < Q_c/Q_{si} < 5$ where $Q_c$ is a supplied amount of carbon contributing to the crystal growth and $Q_{si}$ is a supplied amount of silicon contributing to the crystal growth, is satisfied. By satisfying the relationship $1 < Q_c/Q_{si} < 5$, the amount of carbon in the p-type silicon carbide semiconductor increases so that the boron can occupy silicon site in crystal lattice of the silicon carbide. As a result, the acceptor level determining the activation rate of boron becomes shallower and a p-type silicon carbide semiconductor having a high carrier concentration and a high activation rate is obtained.

In accordance with another aspect of the present invention, there is provided a process for preparing a p-type silicon carbide semiconductor, comprising the steps of depositing on a substrate a single crystal silicon carbide semiconductor with boron doped as an acceptor impurity, and subsequently introducing carbon into the single crystal silicon carbide semiconductor by ion implantation, so that the amount of carbon atoms in the silicon carbide is increased. As a result, boron can occupy the silicon site and the acceptor level determining the activation rate of boron becomes shallower and a p-type silicon carbide semiconductor having a high carrier concentration and a high activation rate is obtained.

In accordance with another aspect of the present invention, there is provided a process for preparing a p-type silicon carbide semiconductor, comprising the steps of preparing a single crystal silicon carbide semiconductor, introducing boron into the single crystal silicon carbide semiconductor by ion implantation as an acceptor impurity and introducing carbon into the single crystal silicon carbide semiconductor. As a result, the amount of carbon atoms in the silicon carbide is increased. Boron can occupy the silicon site and the acceptor level determining the activation rate of boron becomes shallower and a p-type silicon carbide semiconductor having a high carrier concentration and a high activation rate is obtained.

In accordance with another aspect of the present invention, the p-type silicon carbide semiconductor is made to satisfy a relationship $1 < d_c/d_{si} < 32/31$ where $d_c$ is an atomic density of carbon and $d_{si}$ is an atomic density of silicon. As a result, boron can occupy the silicon site and the acceptor level determining the activation rate of boron becomes shallower and a p-type silicon carbide semiconductor having a high carrier concentration and a high activation rate is obtained.

In accordance with another aspect of the present invention, carbon and boron are introduced such that it satisfies a relationship $d_c \geq d_B$ where $d_c$ is an atomic density of the post-introduced or ion-implanted carbon and $d_B$ is an atomic density of boron. As a result, a p-type silicon carbide semiconductor satisfying $d_c - d_{si} \geq d_B$ is obtained.

In accordance with another aspect of the present invention, the introduction of carbon is controlled such that an atomic density distribution of carbon in the p-type silicon carbide semiconductor in the depth direction thereof is substantially the same as that of boron. As a result, the atomic density distributions in the depth direction of the carbon and boron are desirably controlled.

BRIEF DESCRIPTION OF DRAWINGS

FIGS. 4A and 4B are contour lines of the square of the wave function of the acceptor on the (110) plane 110 when a boron atom is arranged at a carbon site in the 64 atom model and the corresponding chemical structures;

DESCRIPTION OF PREFERRED EMBODIMENTS

Figure 1A:
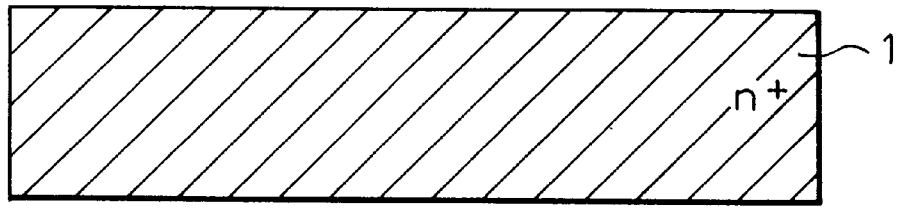
FIGS. 1A to 1C are sectional views of an epitaxial substrate in the first embodiment of the present invention.
Figure 1B:
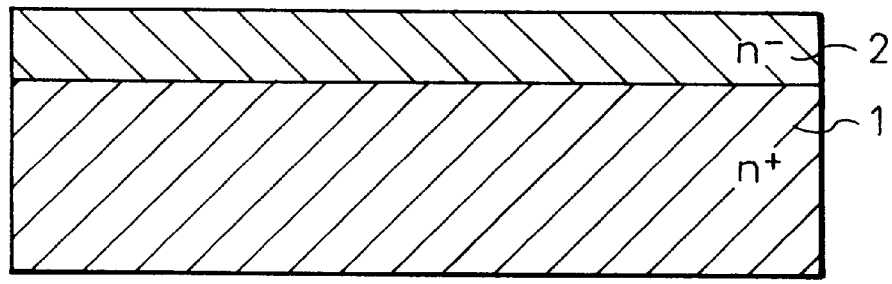
Figure 1C:
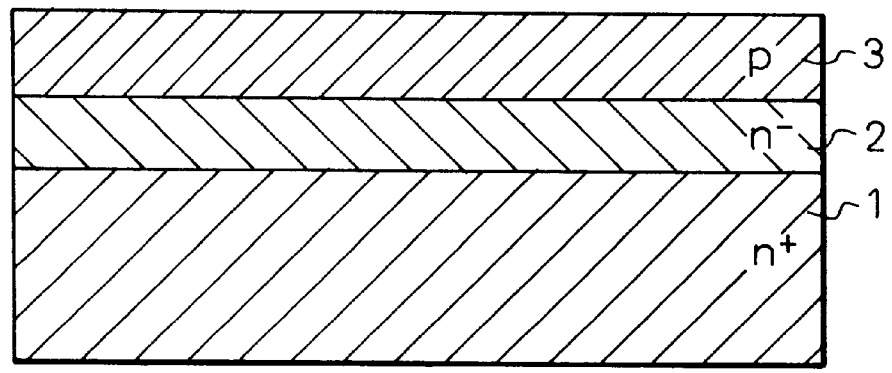

The first embodiment relates to an epitaxial substrate, FIGS. 1A to 1C.

Referring to FIG. 1A, an n⁺-type single crystal silicon carbide semiconductor substrate 1 is provided. On the n⁺-type single crystal silicon carbide semiconductor substrate 1, an n⁻-type silicon carbide semiconductor layer 2 is epitaxially grown by CVD (FIG. 1B). Referring to FIG. 1C, a boron-doped p-type silicon carbide semiconductor layer 3 by is epitaxially grown on the n-type silicon carbide semiconductor layer 2 CVD the CVD process uses a $SiH_4$ gas, a $C_3H_8$ gas and a $B_2H_6$ gas as starting gases, to manufacture a double epitaxial single crystal silicon carbide substrate. Here, the amounts of the starting gases of $SiH_4$ gas and $C_3H_8$ gas are controlled such that the amount of carbon supplied, $Q_c$, and the amount of silicon supplied, $Q_{si}$, satisfies the relationship $1 < Q_c/Q_{si} < 5$. The amount of carbon supplied $Q_c$ is larger than the amount of silicon supplied $Q_{si}$ at $1 < Q_c/Q_{si}$. A silicon carbide crystal can be grown at $Q_c/Q_{si} < 5$.

In the starting gases, a $Si_2H_6$ gas may substitute for the $SiH_4$ gas and a $C_2H_4$ gas or a $C_2H_2$ gas may substitute for the $C_3H_8$ gas.

In the thus grown p-type silicon carbide semiconductor layer 3, the relationship $1 < d_c/d_{si} \leq 32/31$ may be satisfied where $d_c$ is an atomic density of carbon and $d_{si}$ is an atomic density of silicon. The boron occupies the silicon site, the p-type silicon carbide has a shallower acceptor level than when it is silicon rich, and the p-type silicon carbide has a high carrier concentration and a high carrier activation rate. It is contemplated that the carbon rich state may be i) a state in which the excess carbons exist between crystal lattice, ii) a state in which the silicon sites include vacancies, iii) a state in which the excess carbons occupy some silicon sites, and/or iv) a state in which boron atoms occupy some silicon sites. In the present invention, the carbon rich state should however be ii) a state in which the silicon sites include vacancies, iii) a state in which the excess carbons occupy some silicon sites, and/or iv) a state in which boron atoms occupy some silicon sites. Further, $(d_c - d_{si}) \geq d_B$ where $d_c$ is an atomic density of carbon, $d_{si}$ is an atomic density of silicon and $d_B$ is an atomic density of boron, should be satisfied. $(d_c - d_{si}) = d_B$ is the minimum condition for substituting all boron atoms for carbon atoms.

The following is the theoretical explanation of the above.

The activation rate-determining acceptor level of boron doped silicon carbide semiconductor is considered to be different depending on which of the silicon site or the carbon site the boron impurity occupies.

The inventors of the present invention made a silicon carbide crystal model composed of 64 atoms and calculated the acceptor level, the electron state, and the formation energy when only one silicon site or carbon site is substituted by a boron atom, by numerical analysis using the first principle (For example, Journal of Japanese Society of Physics, Vol. 48, No. 6 (1993) p.425) without referring to any experimental values or coefficients.

First, the impurity level in the inhibiting band in the energy band is analyzed for the boron as an acceptor impurity in a silicon carbide semiconductor. The result is shown in Table 1.

TABLE 1

|  | Silicon site | Carbon site |
|---|---|---|
| Acceptor level | 10 meV | 260 meV |

It was found in Table 1 that the acceptor level in the 64 atom silicon carbide crystal model is shallower when a boron atom occupies the silicon site than when a boron atom occupies the carbon site.

Figure 2:
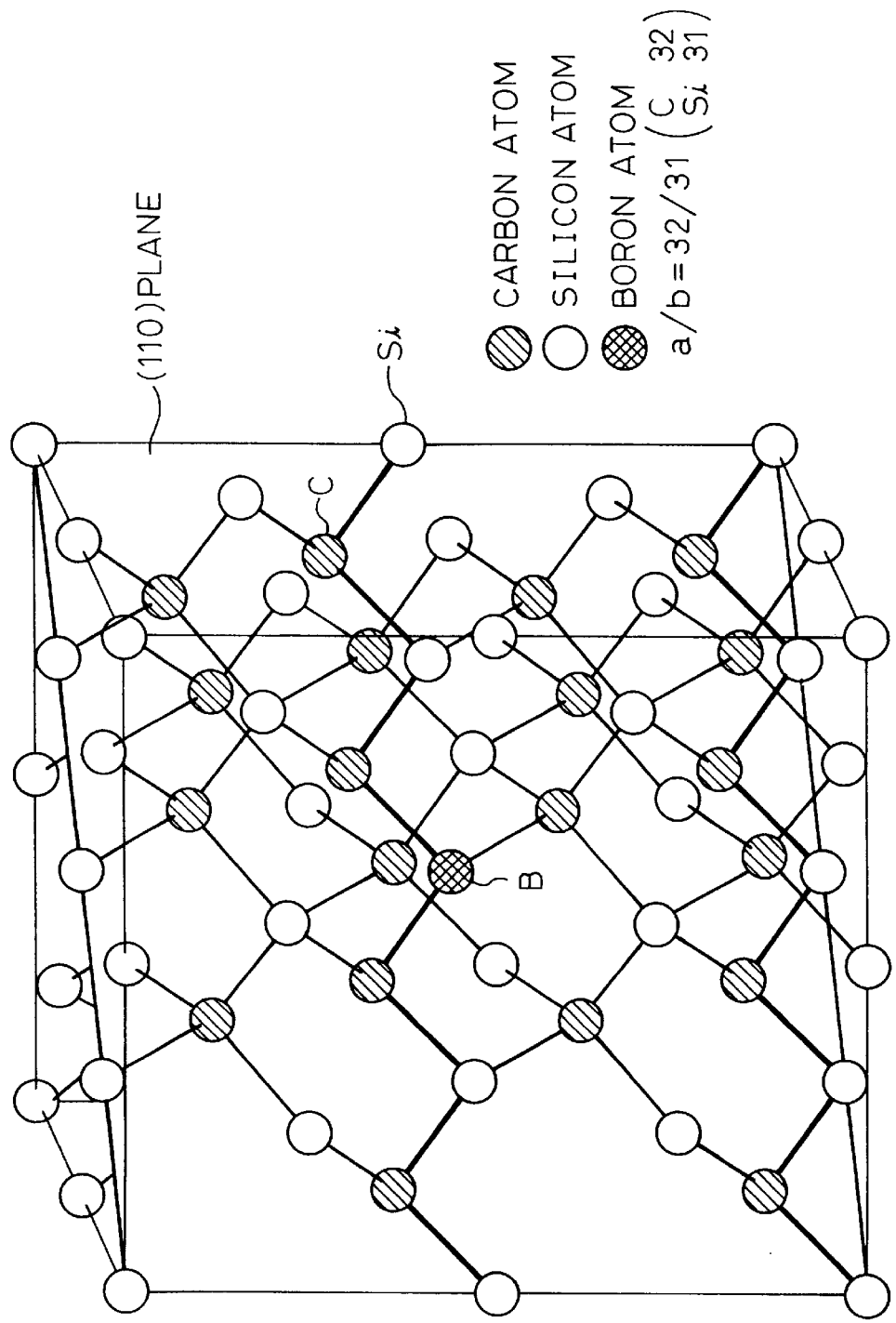
FIG. 2 shows a 64 atom silicon carbide model.
Figure 3B:
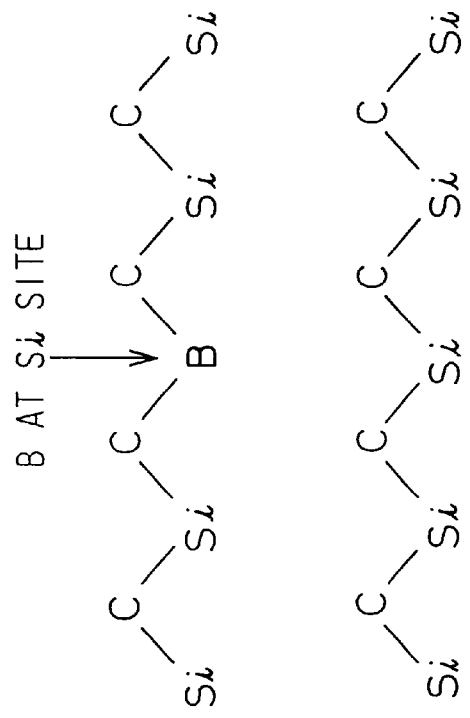
FIGS. 3A and 3B are contour lines of the square of the wave function of the acceptor on the (110) plane 110 when a boron atom is arranged at a silicon site in the 64 atom model and the corresponding chemical structures.
Figure 3A:
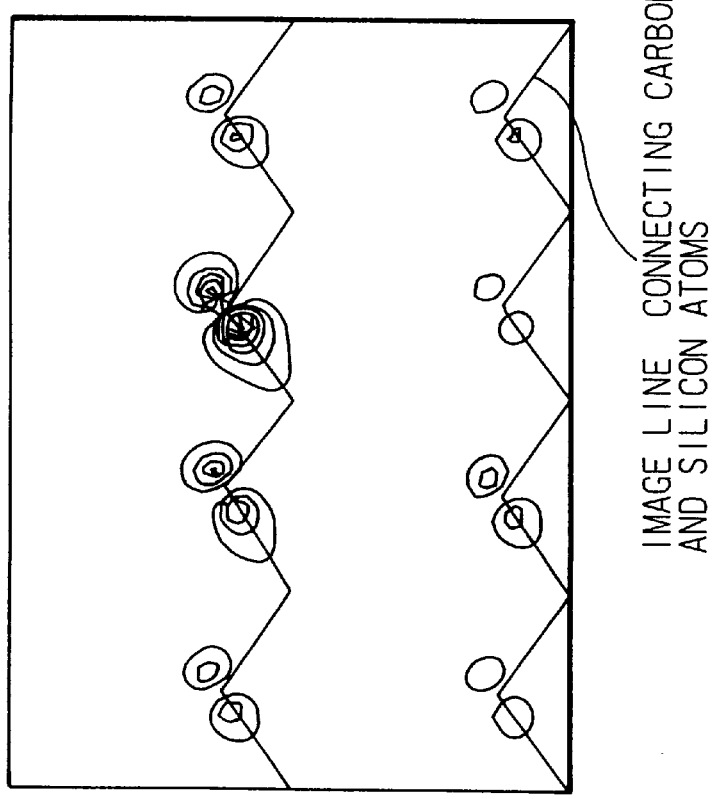

FIG. 2 shows the 64 atom silicon carbide crystal model. FIGS. 3A and 3B show the contour lines of the square of the wave function of the acceptor on plane 110 when only one boron atom is located at the silicon site in the model as shown in FIG. 2. The wave function is distributed over the entire region of the 64 atom silicon carbide crystal model. FIGS. 4A and 4B show the contour lines of the square of the wave function of the acceptor on the plane 110 when only one boron atom is located at the carbon site in the model as shown in FIG. 2. It was found from comparing the distributions of the wave functions in these figures that the localization of the electron is weaker and the acceptor level is shallower when the boron atom exists at the silicon site than when the boron atom exists at the carbon site.

Once it was discovered from the analysis that a shallower acceptor level is obtained when the boron atom exists at the silicon site, analysis was performed regarding which of silicon and carbon sites boron can exist more stably by calculating the formation energy.

The analysis included the following two methods. First, the formation energy was analyzed using the chemical potentials for the case where only one boron atom exists at a silicon site in the 64 atom crystal model and for the case where only one boron atom exists at a carbon site in the model. Here it was assumed that there is no defect other than the boron arranged at the silicon or carbon site. The formation energy $E_f$ is represented by $$E_f = E(n_{si}, n_c, n_B) - n_{si}\mu_{si} - n_c\mu_c - n_B\mu_B \qquad (1)$$

where $E(n_{si}, n_c, n_B)$ is the total energy of the 64 atom crystal model; $\mu_{si}$, $\mu_c$ and $\mu_B$ are chemical potentials of the silicon, carbon and boron; and $n_{si}$, $n_c$ and $n_B$ are the number of the silicon, carbon and boron atoms in the model.

Here the formation energy in the case where the boron exists at the silicon site is represented by $E_f(B_{si})$ and the formation energy in the case where the boron exists at the carbon site is represented by $E_f(B_c)$. The difference of the formation energies is represented by $$E_f(B_{si}) - E_f(B_c) = E(32Si, 31C, 1B) + \mu_{si} - \mu_c \qquad (2)$$

If the value of $E_f(B_{si}) - E_f(B_c)$ is positive, the boron exists at the carbon site. If the value is negative, the boron exists at the silicon site. If the chemical potential of the defect-free or complete crystal of silicon carbide is represented by $\mu_{si(bulk)}$, $$\mu_{si} - \mu_c = \mu_{si(bulk)} \qquad (3)$$

Between the chemical potentials of the complete crystals of silicon carbide, silicon and carbon or diamond $\mu_{si(bulk)}$, $\mu_{si(bulk)}$, $\mu_{c(bulk)}$ and the formation energy of silicon carbide $\Delta H_f$, there is the relationship $$\mu_{si(bulk)} = \mu_{si(bulk)} + \mu_{c(bulk)} + \Delta H_f \qquad (4)$$

Here, $\Delta H_f = -0.7$ eV for silicon carbide.

If the following is defined from the formulae (3) and (4), $$\mu_{si} = \mu_{si(bulk)} + \Delta\mu \qquad (5)$$

the formula (2) is represented as below from the formulae (3), (4) and (5):

$$E_f(B_{si}) - E_f(B_c) = 1.0 + 2\Delta\mu \; (eV) \qquad (6)$$

The possible range of the chemical potential $\Delta\mu$ is considered.

The maximum value of $\mu_{si}$ is "zero" since it is taken under the same conditions as those for taking $\mu_{si(bulk)}$. The maximum value of $\mu_{si}$ is taken when $\mu_c$ and $\mu_{c(bulk)}$ are equal and is equal to $\mu_{si(bulk)} + \Delta H_f$, which is $-0.7$ eV. Accordingly, $\Delta\mu$ can take the following range:

$$-0.7 < \Delta\mu < 0 \qquad (7)$$

As described before, the boron is stable at the carbon site if the value of $E_f(B_{si}) - E_f(B_c)$ is positive, and the boron is stable at the silicon site if the value is negative. If the atomic density of carbon is larger than that of silicon, it is called carbon rich. If the atomic density of carbon is smaller than that of silicon, it is called silicon rich. The results of the calculation of the difference of the formation energy, $E_f(B_{si}) - E_f(B_c)$, are shown in Table 2.

TABLE 2

|  | carbon rich | silicon rich |
|---|---|---|
| $\Delta\mu$ | −0.7 | 0.0 |
| $E_f(B_{si}) - E_f(B_c)$ | −0.4 eV | 1.0 eV |

It was thus found that in the carbon rich model the difference of the formation energy $E_f(B_{si}) - E_f(B_c)$ is negative and the boron is stable at the silicon site and that in the silicon rich model the difference of the formation energy, $E_f(B_{si}) - E_f(B_c)$, is positive and the boron is stable at the carbon site.

Next, the formation energy was analyzed using the chemical potentials for the case where only one boron atom exists at a silicon site in the 64 atom crystal model and the case where only one boron atom exists at a carbon site in the model, provided that there are defects other than the boron arranged at the silicon or carbon site.

The formation energy $E_f$ is represented by $$E_f = [E(n_{si}, n_c, n_B) - n_s E_{si}^M - n_c E_c^M - n_B E_B^M] - [E_p(32, 32, 0) - 32E_{si}^M - 32E_c^M](n_{si} + n_c + n_B)/64 \qquad (8)$$

where $E_{si}^M$, $E_c^M$ and $E_B^M$ are the energies of an isolated electrons in which the pseudo-potentials of silicon, carbon and boron are used respectively.

The formula (8) is intended to define the formation energy by the difference of the coherent energy between the case of the 64 atom complete crystal model and the case of defective model.

It is assumed that the reaction as the following formula (9) occurs concerning the defect:

$$X + (boron) \rightarrow Y - \Delta E \qquad (9)$$

$$\Delta E = E_f(Y) - E_f(X) \qquad (10)$$

The smaller is the $\Delta E$ in the formula (9), the more easily the reaction occurs.

The silicon rich model is considered and discussed below.

In the silicon rich model, the case where silicon exists between the crystal lattice, the case where a carbon site is a vacancy and the case where silicon is substituted at the carbon site, were considered. When the formation energies for the cases were calculated using the 64 atom model, the case where a carbon site is a vacancy was the most stable (most likely be formed in the possibility theory from the energy viewpoint) for a p-type silicon carbide, and the case where a silicon exists at a carbon site was the most stable for an n-type silicon carbide. The reactions are shown in Table 3 for these most stable case models in which a boron atom is substituted at a silicon or carbon site.

TABLE 3

|  | Reaction |
|---|---|
| Si-rich, p-type<br>B at Si-site | $B \rightarrow B_{si} + V_c^{2+} + 2.4$ eV |
| Si-rich, p-type<br>B at C-site | $V_c^{2+} + B \rightarrow B_c + 2.0$ eV |
| Si-rich, n-type<br>B at Si-site | $B \rightarrow B_{si}^- + 1/2Si_c + 4.5$ ev |

TABLE 3-continued

| | Reaction |
|---|---|
| Si-rich, n-type B at C-site | $1/2Si_c + B \rightarrow B_c^- + 0.3$ eV |

Note)
$B_{si}$: boron existing at silicon site
$B_{si}^-$: −1 valence boron existing at silicon site
$B_c$: boron existing at carbon site
$B_c^-$: −1 valence boron existing at carbon site
$V_c^{2+}$: −2 valence vacancy existing at carbon site
$Si_c$: silicon existing at carbon site
$C_{si}$: carbon existing at silicon site It was found that in the silicon rich model, ΔE is the smallest in the case where a boron exists at a carbon site for both the n-type and p-type silicon carbides. That is, the boron is more stable at the carbon site irrespective of the conductivity-type. It was also found that in the silicon rich model of a p-type silicon carbide having a vacancy, a shallow donor level appears and the function of the boron doped as an acceptor impurity is inhibited. Therefore it is preferred that a vacancy at the carbon site should be prevented.

The carbon rich model is considered and discussed below.

As in the silicon rich model, the case where carbon exists between the crystal lattice, the case where a silicon site is a vacancy and the case where carbon is substituted at the silicon site, were considered. When the formation energies for the cases were calculated using the 64 atom model, the case where a carbon atom exists at a silicon site was the most stable (most likely be formed in the possibility theory from an energy view point) irrespective of the conductivity-type. The reactions are shown in Table 4 for the most stable case in which a boron atom is substituted at a silicon or carbon site.

TABLE 4

| | Reaction |
|---|---|
| C-rich B at Si-site | $1/2C_{si} + B \rightarrow B_{si} + 0.5$ eV |
| C-rich B at C-site | $B \rightarrow B_c + 1/2C_{si} + 3.9$ eV |

It was found that in the carbon rich model, ΔE is the smallest in the case where a boron exists at a silicon site. That is, the boron is more stable at the silicon site irrespective of the conductivity-type. It was also found that in the 64 atom model in which a carbon atom exists at a silicon site, an additional level does not appear since the carbon atom of the IV-group element substitutes the silicon atom of the same IV-group element. Therefore, the function of the boron doped as an acceptor impurity is not inhibited.

As shown above, the model in which a boron doped in a carbon rich silicon carbide semiconductor exists at a silicon site is more stable and attains a shallower acceptor impurity level. In the model in which a silicon site of a silicon rich p-type silicon carbide is a vacancy, a shallower donor level to inhibit the function of the boron doped as an acceptor impurity is formed. Therefore it is preferred that vacancies do not exist at carbon sites, in order that the boron acts as an acceptor impurity.

As described above, in this embodiment, a p-type single crystal silicon carbide semiconductor 3 is grown while carbon contributing to crystal growth is supplied in an amount higher than that of silicon contributing to crystal growth, so that the atomic density of carbon $d_c$ is made larger than that of silicon $d_{si}$ in the grown silicon carbide. This is, the carbon content is increased, preferably satisfying the relationship $1<d_c/d_{si} \leq 32/21$, and the doped boron can exist at a silicon site. As a result, the acceptor level determining the activation rate of boron becomes shallower and a p-type single crystal silicon carbide semiconductor having a high carrier concentration and activation rate is obtained.

In the above embodiment, an epitaxial substrate having the p/n⁻/n⁺ structure is illustrated as shown in FIGS. 1A to 1C. However, an epitaxial substrate having the n/p⁻/n⁺ structure as shown in FIGS. 5A to 5C may be also used.

Figure 5A:
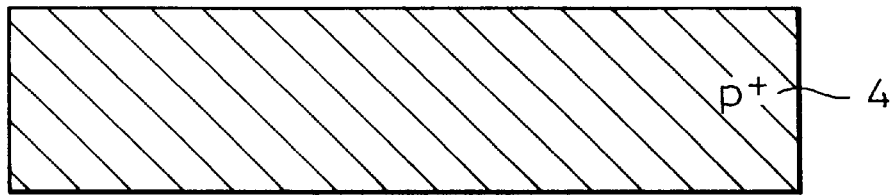
FIGS. 5A to 5C are sectional views of an epitaxial substrate in a modified example of the first embodiment of the present invention.
Figure 5B:
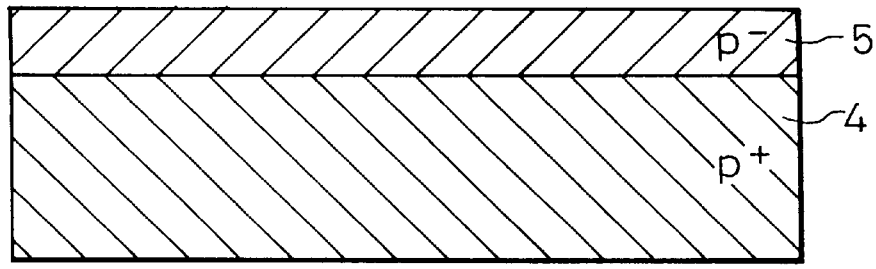
Figure 5C:
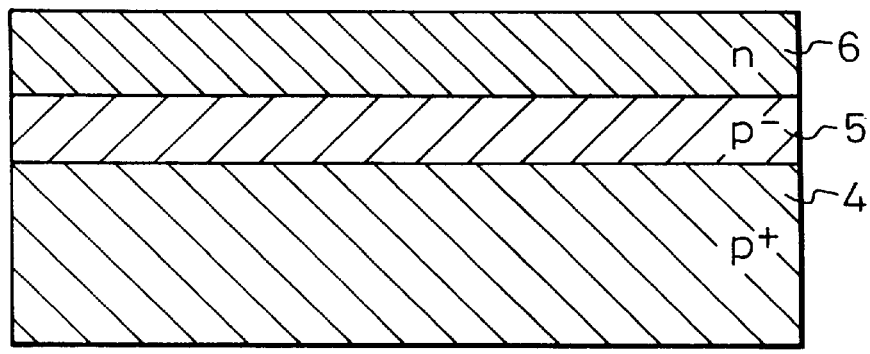

FIG. 5A illustrates a p⁺-type single crystal silicon carbide semiconductor substrate 4. FIG. 5b illustrates a p⁻-type silicon carbide semiconductor layer 5 epitaxially grown by CVD, on substrate 4. Further, as shown in FIG. 5C, an n-type silicon carbide semiconductor layer 6 is epitaxially grown on the surface of the p⁻-type silicon carbide semiconductor layer 5 by CVD, to prepare a double epitaxial single crystal silicon carbide semiconductor substrate. In this case, the relationship $1<Q_c/Q_{si}<5$ where $Q_c$ is the amount of the carbon supplied and contributing to the crystal growth and $Q_{si}$ is the amount of silicon supplied and contributing to the crystal growth, may also be satisfied by the supplied starting gases (SiH₄ gas and C₃H₈ gas) for growing the p⁻-type silicon carbide semiconductor layer 5.

Figure 6A:
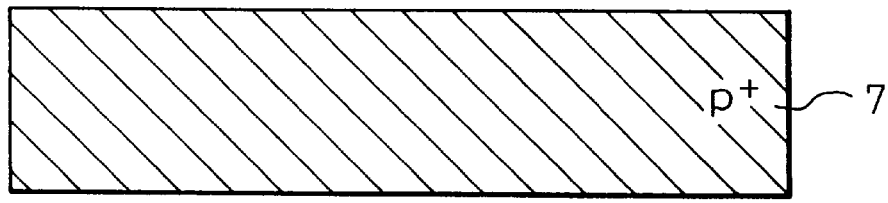
FIGS. 6A to 6B are sectional views of an epitaxial substrate in another modified example of the first embodiment of the present invention.
Figure 6B:
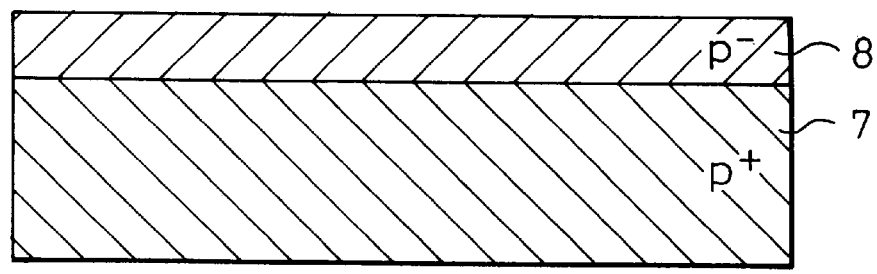

In a further embodiment shown in FIGS. 6A and 6B, a p⁺-type single crystal silicon carbide semiconductor substrate 7 is provided (see FIG. 6A), on the surface of which is a p⁻-type silicon carbide semiconductor layer 8 epitaxially grown by CVD (see FIG. 6B). Here, the relationship $1<Q_c/Q_{si}<5$ where $Q_c$ is the amount of the carbon supplied and contributing to the crystal growth and $Q_{si}$ is the amount of silicon supplied and contributing to the crystal growth, may be satisfied by the supplied starting gases (SiH₄ gas and C₃H₈ gas) for growing the p⁻-type silicon carbide semiconductor layer 8.

The second embodiment is described with reference to FIGS. 7A to 7J.

This embodiment relates to an n-channel vertical SiC-MOSFET. As shown in FIG. 7J, this MOSFET comprises contact between a source electrode 19 and a p-type silicon carbide semiconductor layer 13 through a low resistivity p-type silicon carbide layer 15.

Figure 7A:
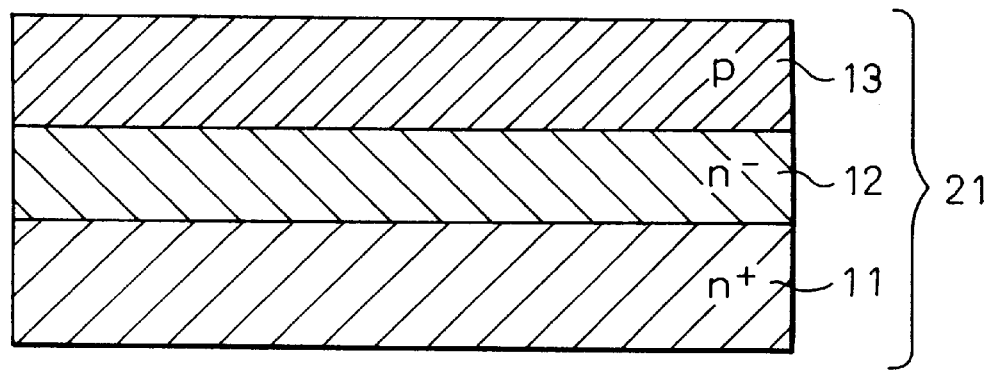
FIGS. 7A to 7J are sectional views of an n-channel vertical SiC-MOSFET in the second embodiment of the present invention.

FIG. 7A illustrates an n⁺-type single crystal silicon carbide semiconductor substrate 11. An, n⁻-type silicon carbide semiconductor layer 12 is epitaxially grown by CVD on the surface of the substrate 11. A p-type silicon carbide semiconductor layer 13 is epitaxially grown by CVD on layer 12. Thus, a silicon carbide semiconductor substrate 21 is formed.

Figure 7B:
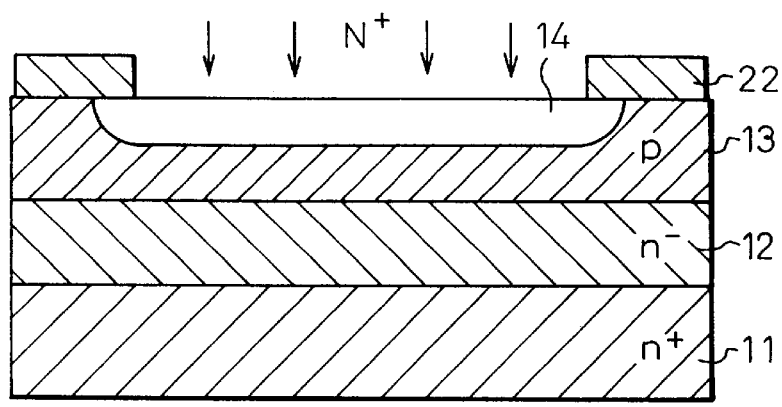

Referring to FIG. 7B, a mask 22 is provided on the surface of the silicon carbide semiconductor substrate 21 and nitrogen ions are implanted into a predetermined region 14 of the silicon carbide semiconductor substrate 21 with the mask 22 to form an n⁺-type silicon carbide semiconductor region 14.

Figure 7C:
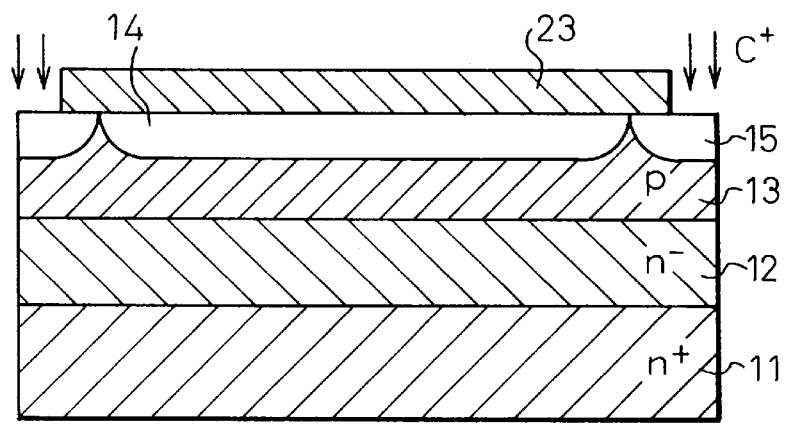
Figure 7D:
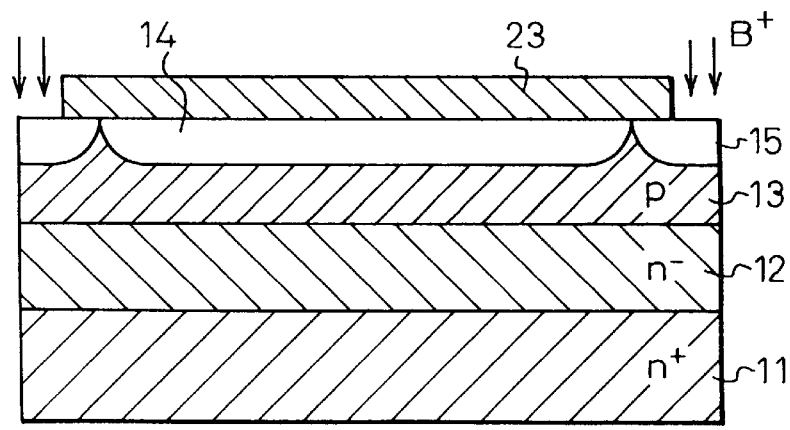
Figure 8:
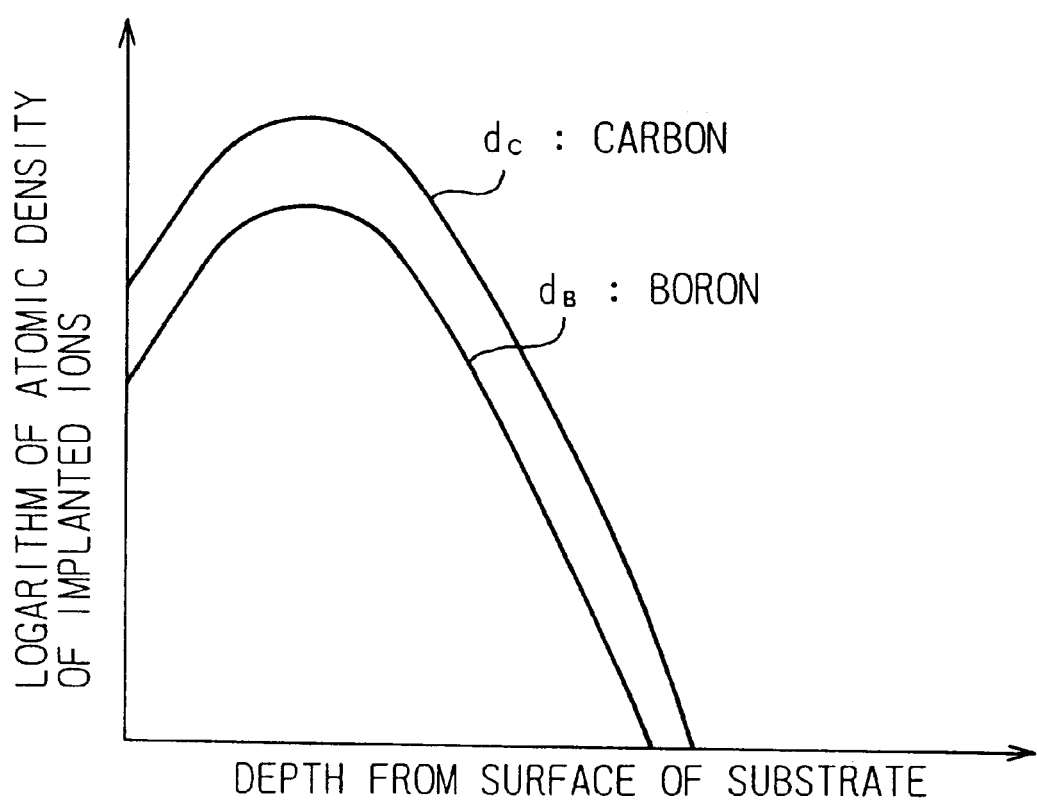
FIG. 8 shows the atomic density distribution of the ion implanted boron and carbon atoms.

Referring to FIGS. 7C and 7D, a mask 23 of, e.g., a silicon oxide layer, is provided on the surface of the silicon carbide semiconductor substrate 21. With the mask 23, carbon and then boron are ion implanted into a predetermined region 15 of the p-type silicon carbide semiconductor layer 13. Here, it is desired that carbon and boron are introduced so as to satisfy the relationship $d_c \geq d_B$ where $d_c$ and $d_B$ are atomic densities of the ion-implanted carbon and boron, as shown in FIG. 8. It is further desired that the atomic density distribution of the implanted carbon in the depth direction is almost the same as that of the implanted boron. The atomic density distribution can be controlled by controlling the acceleration voltage and implanted ion amount of the ion implantation. It is noted that the order of introduction of carbon and boron is not limited and can be reversed.

Figure 7E:
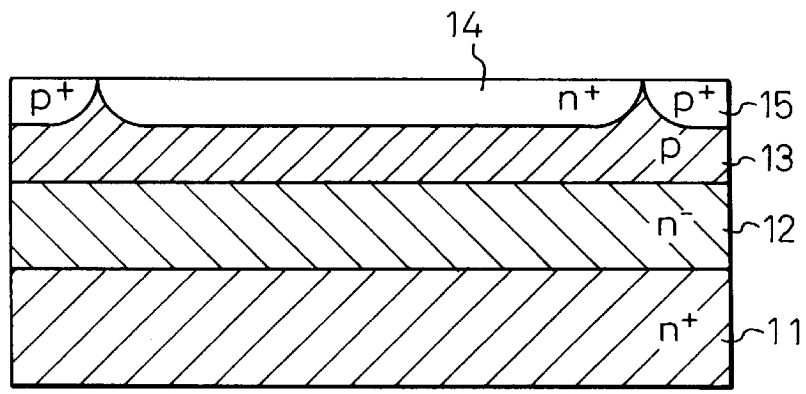

Referring to FIG. 7E, the mask 23 is removed and heat treatment is conducted to recover the crystallinity and activate the boron. Thus, a low resistivity p$^+$-type silicon carbide semiconductor region 15 is formed around the n$^+$-type silicon carbide semiconductor region 14.

Figure 7F:
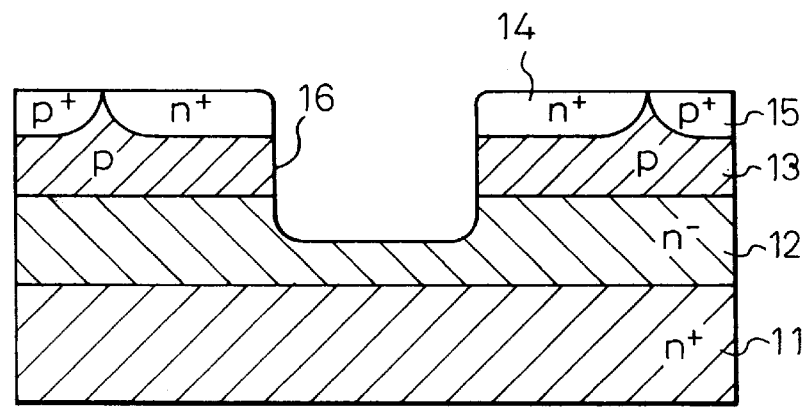

Referring to FIG. 7F, a groove 16, penetrating the source region 14 and the p-type silicon carbide semiconductor layer 13 and reaching the n$^-$-type silicon carbide semiconductor layer 12, is formed.

Figure 7G:
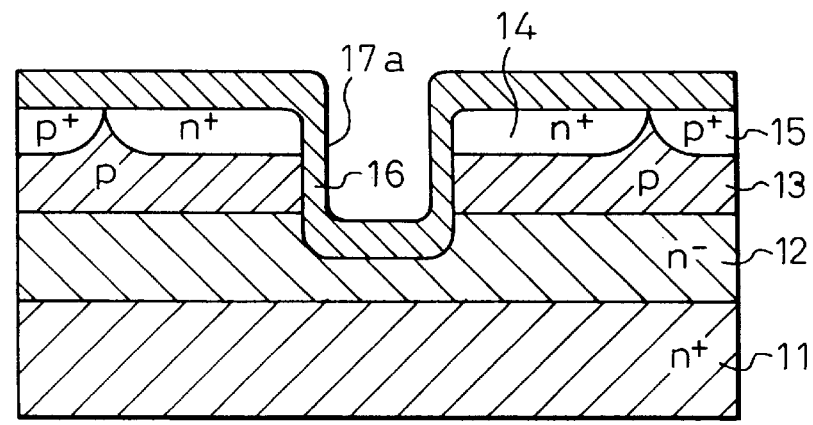

Referring to FIG. 7G, an oxide film 17a for forming a gate oxide film is formed on the surface of the substrate 21 including the inside of the groove 16.

Figure 7H:
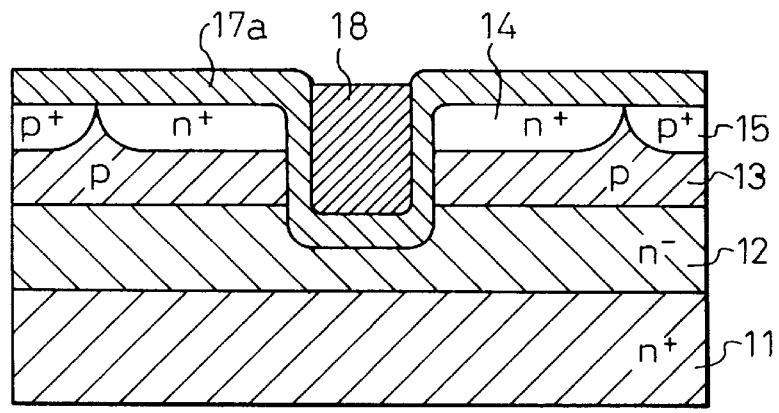

Referring to FIG. 7H, a gate electrode 18 is formed on the oxide film 17a in the groove 16.

Figure 7I:
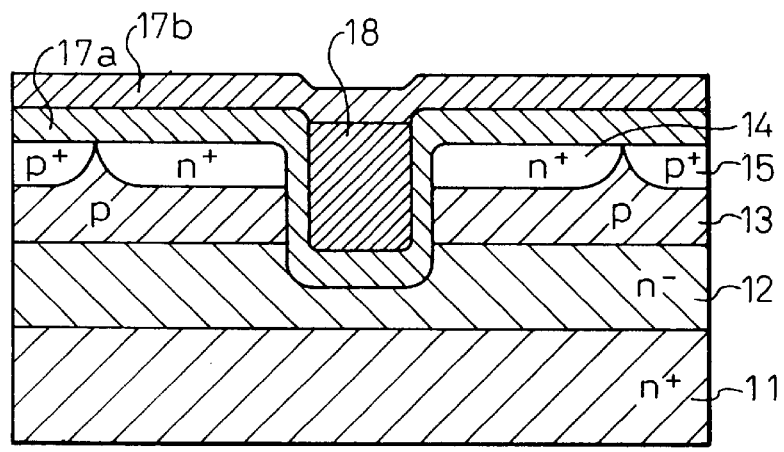
Figure 7J:
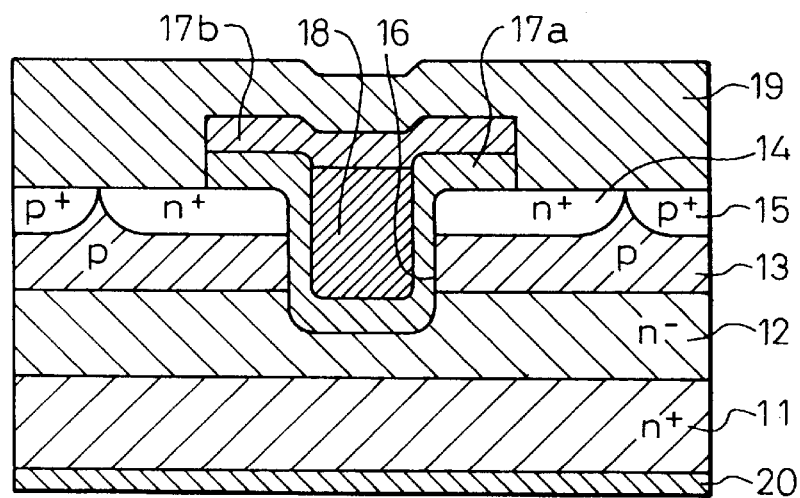

Referring to FIG. 7I, an oxide film 17b is formed on the gate electrode 18 and the oxide film 17a.

Referring to FIG. 7J, the oxide films 17a and 17b are removed except for the region on and around the groove 16, and a source electrode 19 is deposited on the substrate. As a result, the source electrode 19 is in contact with the source region 14 and the low resistivity p-type silicon carbide region 15. The electrodes for the source region 14 and the low resistivity p-type silicon carbide region 15 may be separately formed of separate materials. A drain electrode 20 is provide on the rear surface of the n$^+$-type single crystal silicon carbide semiconductor substrate 11.

Thus, an n-channel vertical SiC-MOSFET is manufactured.

In this embodiment, the content of carbon atoms is increased by adding the implantation of carbon ions while forming a p-type single crystal silicon carbide semiconductor 15 by implanting boron ions in the single crystal silicon carbide semiconductor 13. That is, implanting boron ions and then carbon ions or implanting carbon ions into the single crystal silicon carbide semiconductor 13; and then boron ions is conducted to increase the content of carbon atoms in the single crystal silicon carbide semiconductor 13. By increasing in the content of carbon atoms, implanted boron can be present at silicon site. As a result, the acceptor level determining the activation rate of boron becomes shallower and a p-type silicon carbide semiconductor having a high carrier concentration and activation rate is obtained.

Since the ion implantation is used, the p-type silicon carbide semiconductor can be arbitrary formed in a desired region, in comparison with the CVD.

As shown in FIG. 8, the ion implantation is conducted in such a way that the relationship $d_c \geq d_B$ where $d_c$ is an atomic density of the carbon implanted and $d_B$ is an atomic density of the boron that is implanted and have existed. As a result, the relationship $(d_c - d_{si}) \geq d_B$ where $d_c$, $d_{si}$ and $d_B$ are atomic densities of the carbon, silicon and boron in the silicon carbide, may be satisfied.

As shown in FIG. 8, the atomic density distribution of the implanted carbon in the depth direction is made almost equal to the atomic density distribution of the implanted boron in the depth direction by controlling the conditions of the ion implantation. Accordingly, a desired carrier density distribution in the depth direction can be obtained by controlling the atomic density of boron and that of the carbon in the depth direction.

In the above example, a boron-ion implanted single crystal silicon carbide semiconductor 13 is first prepared and subsequently carbon ions are implanted to increase the content of carbon atoms. However, a CVD boron-doped single crystal silicon carbide semiconductor may be first prepared and subsequently carbon ions may be implanted to increase the content of carbon atoms. That is, the boron as an acceptor impurity is doped simultaneously with preparing a single crystal silicon carbide semiconductor, followed by implanting carbon ions to increase the content of carbon atoms. By this increase in the content of carbon atoms, implanted boron can be present at silicon site. As a result, the acceptor level determining the activation rate of boron becomes shallower and a p-type silicon carbide semiconductor having a high carrier concentration and activation rate is obtained. The process of simultaneously preparing a single crystal silicon carbide semiconductor with doping boron may be carried out not only by CVD but also by a sublimation recrystallization method of forming a single crystal silicon carbide semiconductor.

In this implantation of carbon ions into a CVD borondoped single crystal silicon carbide semiconductor, the ion implantation of carbon can be conducted in such a way that the relationship $d_c \geq d_B$ where $d_c$ is an atomic density of the carbon implanted and $d_B$ is an atomic density of the boron that is implanted or has existed. By this, the relationship $(d_c - d_{si}) \geq d_B$ where $d_c$, $d_{si}$ and $d_B$ are respectively the atomic densities of the carbon, silicon and boron in the silicon carbide, may be satisfied.

The above example relates to an n-channel vertical type SiC-MOSFET, but the present invention may be applied to a p-channel vertical type SIC-MOSFET, as shown in FIGS. 9A to 9J.

Figure 9A:
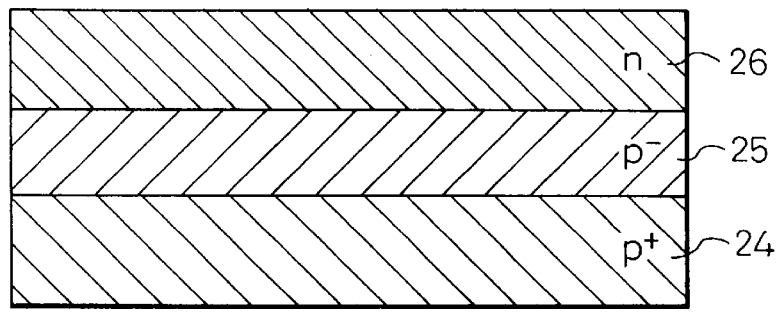
FIGS. 9A to 9J are sectional views of an n-channel vertical SiC-MOSFET in the second embodiment of the present invention.

FIG. 9A illustrates p$^+$-type single crystal silicon carbide semiconductor substrate 24. An p$^-$-type silicon carbide semiconductor layer 25 is epitaxially grown by CVD on substrate 24 the surface of which a n-type silicon carbide semiconductor layer 26 in turn is epitaxially grown by CVD on layer 25.

Figure 9B:
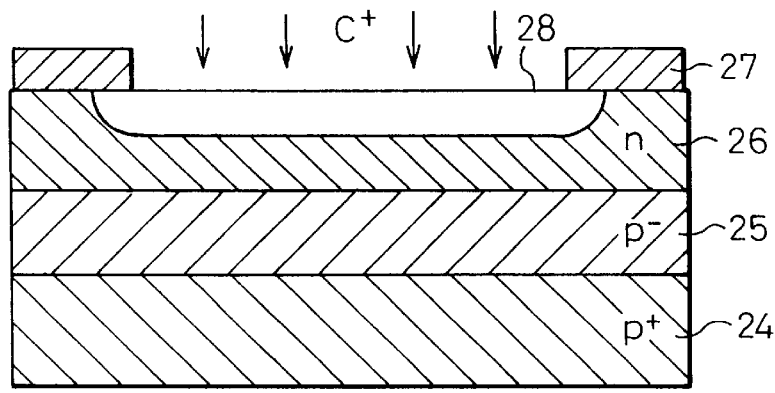
Figure 9C:
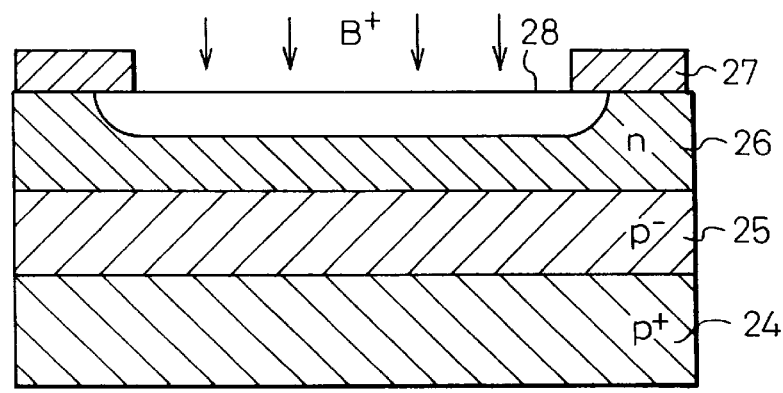

Referring to FIGS. 9B and 9C, a mask 27 is provided on the surface of the n-type silicon carbide semiconductor layer 26 and carbon ions and then boron ions are implanted into a predetermined region 28 of the n-type silicon carbide semiconductor layer 26 with the mask 27. It is desired that carbon and boron are introduced so as to satisfy the relationship $d_c \geq d_B$ where $d_c$ and $d_B$ are atomic densities of the ion implanted carbon and boron, and the atomic density distribution of the implanted carbon in the depth direction is almost the same as that of the implanted boron. Thus, a p$^+$-type silicon carbide semiconductor region 28 is formed and the benefits and effects described above in relation to the doping the boron and carbon.

Figure 9D:
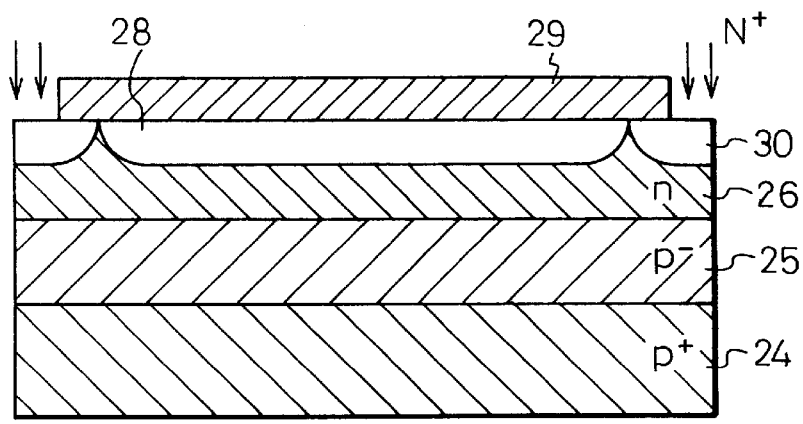

Referring to FIG. 9D, with a mask 29, nitrogen ions are implanted into a predetermined region 30 of the n-type silicon carbide semiconductor layer 26, to form an n$^+$-type silicon carbide semiconductor region 30 around the p$^+$-type silicon carbide semiconductor region 28.

Figure 9E:
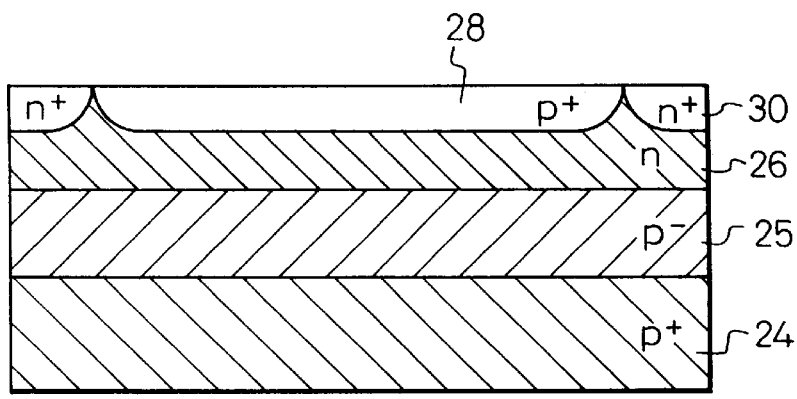

Referring to FIG. 9E, the mask 23 is removed and heat treatment is conducted to recover the crystallinity and activate the boron. Thus, a low resistivity n$^+$-type silicon carbide semiconductor region 30 is formed around the p$^+$-type silicon carbide semiconductor region 28.

Figure 9F:
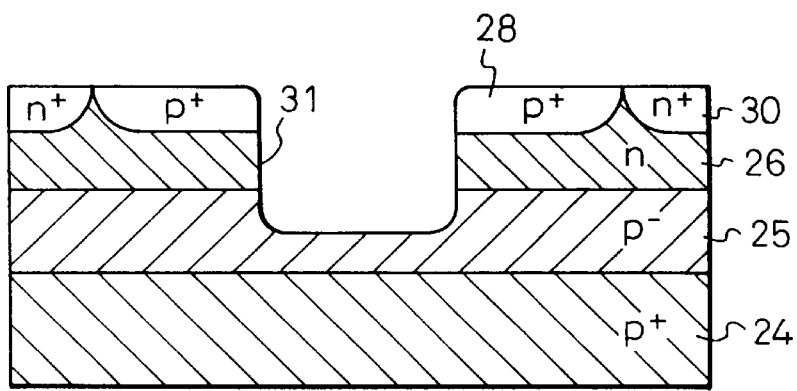

Referring to FIG. 9F, a groove 31, penetrating the source region 28 and the n-type silicon carbide semiconductor layer 26 and reaching the p$^-$-type silicon carbide semiconductor layer 25, is formed.

Figure 9G:
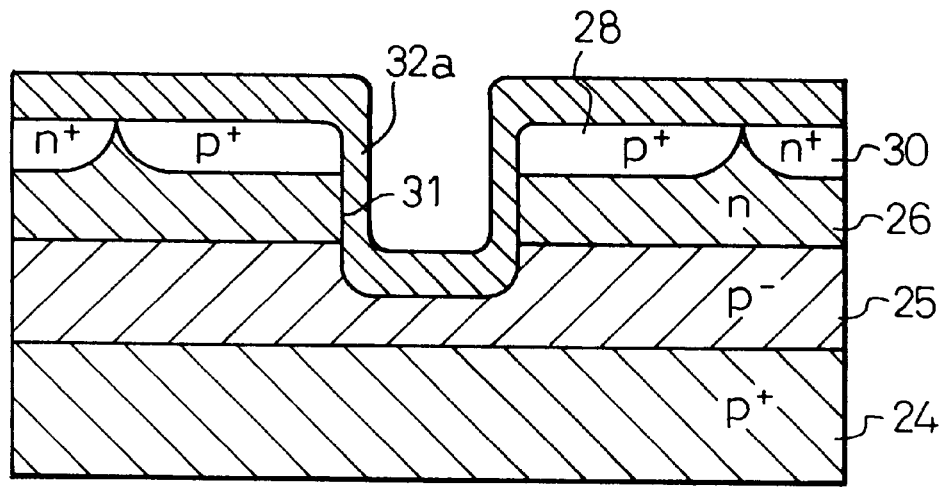

Referring to FIG. 9G, an oxide film 32a for forming a gate oxide film is formed on the surface of the substrate including the inside of the groove 31.

Figure 9H:
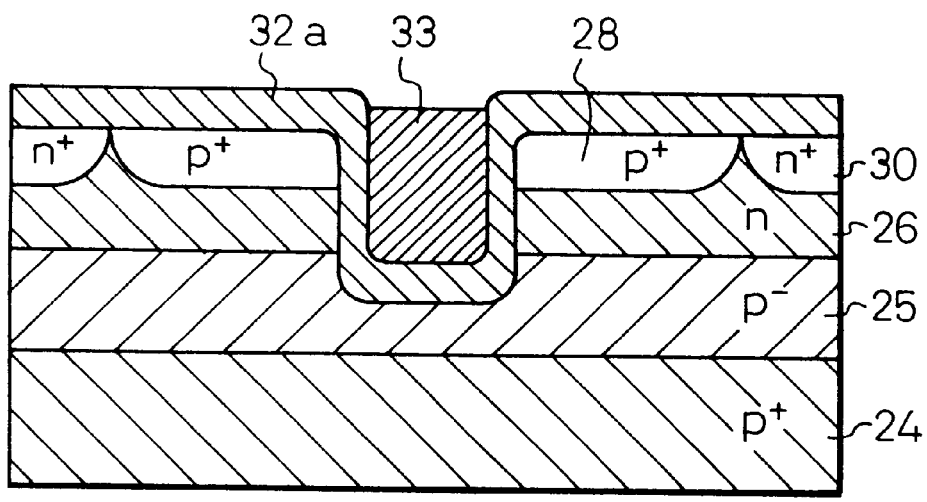

Referring to FIG. 9H, a gate electrode 33 is formed on the oxide film 32a in the groove 31.

Figure 9I:
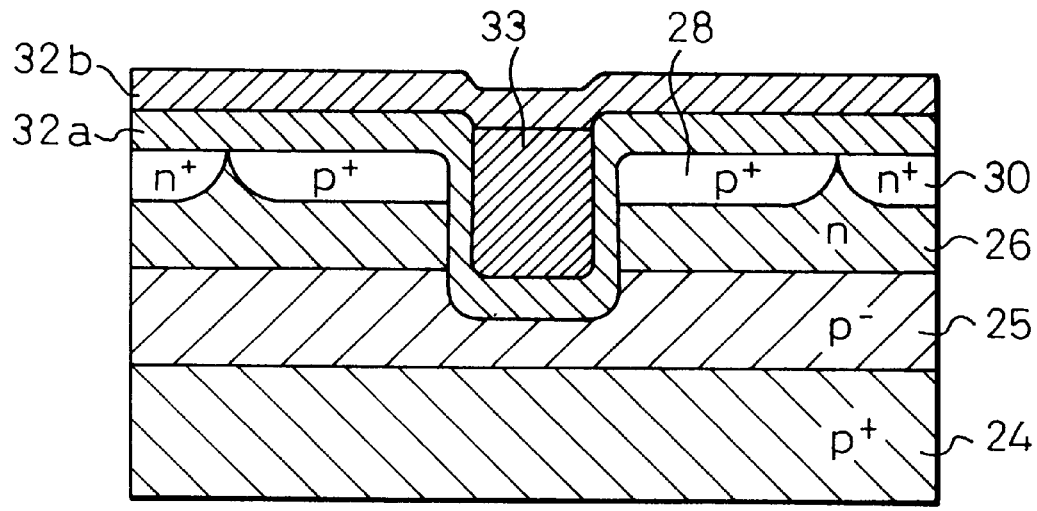

Referring to FIG. 9I, an oxide film 32b is formed on the gate electrode 33 and the oxide film 32a.

Figure 9J:
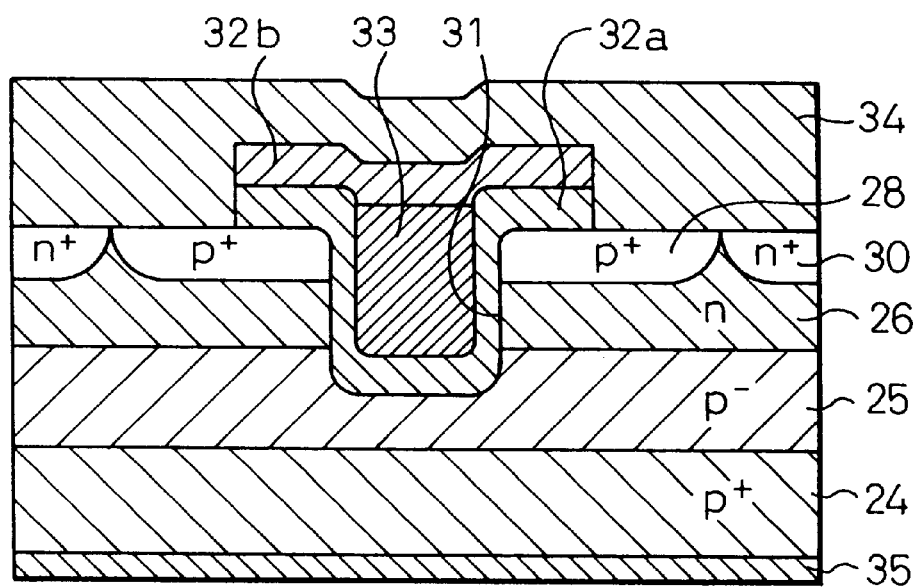

Referring to FIG. 9J, the oxide films 32a and 32b are removed except for the region on and around the groove 31 and a source electrode 34 is deposited on the substrate. A drain electrode 35 is provided on the rear surface of the p+-type single crystal silicon carbide semiconductor substrate 24.

Thus, a p-channel vertical SiC-MOSFET is manufactured.

We claim:

1. A p-type silicon carbide semiconductor in which boron is doped as an acceptor impurity in a single crystal silicon carbide substrate, said p-type silicon carbide semiconductor being carbon rich, said boron occupying at least one silicon site of a crystal lattice of said single crystal silicon carbide substrate;
   wherein said semiconductor satisfies a relationship $1 < d_c/d_{si} \leq 32/31$ where $d_c$ is an atomic density of carbon and $d_{si}$ is an atomic density of silicon.

2. A p-type silicon carbide semiconductor in which boron is doped as an acceptor impurity in a single crystal silicon carbide substrate, said p-type silicon carbide semiconductor being carbon rich, said boron occupying at least one silicon site of a crystal lattice of said single crystal silicon carbide susbstrate;
   wherein said semiconductor satisfies a relationship $1 < d_c/d_{si} \leq 32/31$ where $d_c$ is an atomic density of carbon and $d_{si}$ is an atomic density of silicon.

3. A p-type silicon carbide semiconductor in which boron is doped as an acceptor impurity in a single crystal silicon carbide substrate, said p-type silicon carbide semiconductor being carbon rich, said boron occupying at least one silicon site of a crystal lattice of said single crystal silicon carbide substrate;
   wherein the amount of vacancies on silicon sites in the crystal lattice is greater than the amount of vacancies on carbon sites.

4. A p-type silicon carbide semiconductor in which boron is doped as an acceptor impurity in a single crystal silicon carbide substrate, said p-type silicon carbide semiconductor being carbon rich, said boron occupying at least one silicon site of a crystal lattice of said single crystal silicon carbide substrate;
   wherein some of silicon sites of the crystal lattice of the silicon carbide substrate are occupied by carbon atoms.

5. A process for preparing a p-type silicon carbide semiconductor, comprising:
   simultaneously supplying a gas containing carbon and silicon and a gas containing boron over a single crystal silicon carbide substrate to grow a p-type silicon carbide semiconductor on the substrate by vapor deposition,
   wherein a relationship $1 < Q_c/Q_{si} < 5$, where $Q_c$ is a supplied amount of the carbon contributing to the growth and $Q_{si}$ is a supplied amount of silicon contributing to the growth is satisified, by which the p-type silicon carbide semiconductor is grown in which boron is doped as an acceptor impurity in a single crystal silicon carbide, said p-type silicon carbide semiconductor being carbon rich, said boron occypying at least one silicon site in a crystal lattice of said single crystal silicon carbide;
   wherein a grown p-type silicon carbide semiconductor satisfies a relationship $1 < d_c/d_{si} < 32/31$ where $d_c$ is an atomic density of carbon and $d_{si}$ is an atomic density of silicon.

6. A process for preparing a p-type silicon carbide semiconductor, comprising:
   simutaneously supplying a gas containing carbon and silicon and a gas containing boron over a single crystal silicon carbide substrate to grow a p-type silicon carbide semiconductor on the substrate by vapor deposition,
   wherein a relationship $1 < Q_c/Q_{si} < 5$, where $Q_c$ is a supplied amount of the carbon contributing to the growth and $Q_{si}$ is a supplied amount of silicon contributing to the growth is satisfied, by which the p-type silicon carbide semiconductor is grown in which boron is doped as an acceptor impurity in a single crystal silicon carbide, said p-type silicon carbide semiconductor being carbon rich, said boron occupying at least one silicon site in a crystal lattice of said single crystal silicon carbide;
   wherein said grown p-type silicon carbide semiconductor satisfies the relationship $(d_c - d_{si}) \geq d_B$ where $d_c$ is an atomic density of carbon, $d_{si}$ is an atomic density of silicon and $d_B$ is an atomic density of boron.

7. The process according to claim 6, wherein a grown p-type silicon carbide semiconductor satisfies a relationship $1 < d_c/d_{si} \leq 32/31$ where $d_c$ is an atomic density of carbon and $d_{si}$ is an atomic density of silicon.

8. The process according to claim 6, wherein said grown p-type silicon carbide semiconductor satisfies the relationship $(d_c - d_{si}) \geq d_B$ where $d_c$ is an atomic density of carbon, $d_{si}$ is an atomic density of silicon and $d_B$ is an atomic density of boron.

9. A process for preparing a p-type silicon carbide semiconductor, comprising:
   forming a single crystal silicon carbide semiconductor with boron doped as an acceptor impurity, and
   subsequently introducing carbon into the single crystal silicon carbide semiconductor by ion implantation to obtain the p-type silicon carbide semiconductor with boron doped as an acceptor impurity in a single crystal silicon carbide, said p-type silicon carbide semiconductor being carbon rich, said boron occupying at least one silicon site of a crystal lattice of said single crystal silicon carbide.

10. The process according to claim 9, wherein said p-type silicon carbide semiconductor satisfies a relationship $1 < d_c/d_{si} \leq 32/31$ where $d_c$ is an atomic density of carbon in the p-type silicon carbide semiconductor and $d_{si}$ is an atomic density of silicon in the p-type silicon carbide semiconductor.

11. The process according to claim 9, wherein an introduction of carbon in said introducing carbon satisfies the relationship of $d_c \geq d_B$ where $d_c$ is an atomic density of introduced carbon in said introducing carbon and $d_B$ is an atomic density of said boron.

12. The process according to claim 11, wherein said introduction of carbon is controlled such that an atomic density distribution of carbon in the p-type silicon carbide semiconductor in depth direction thereof is substantially the same as that of the boron.

13. A process for preparing a p-type silicon carbide semiconductor, comprising:
   preparing a single crystal silicon carbide semiconductor,
   introducing boron into the single crystal silicon carbide semiconductor by ion implantation as an acceptor impurity, and
   introducing carbon into the single crystal silicon carbide semiconductor to obtain the p-type silicon carbide semiconductor with boron doped as an acceptor impurity in a single crystal silicon carbide, said p-type silicon carbide semiconductor being carbon rich, said boron occupying at least one silicon site in a crystal lattice of said single crystal silicon carbide.

14. The process according to claim 13, wherein said p-type silicon carbide semiconductor satisfies the relationship $1 < d_c/d_{si} \leq 32/31$ where $d_c$ is an atomic density of carbon in the p-type silicon carbide semiconductor and $d_{si}$ is an atomic density of silicon in the p-type silicon carbide semiconductor.

15. the process according to claim 14, wherein said introduction of carbon in said introducing carbon satisfies the relationship $d_c \geq d_B$ where $d_c$ is an atomic density of introduced carbon by said introducing carbon and $d_B$ is an atomic density of boron in the p-type silicon carbide semiconductor and a relationship $(d_c - d_{si}) \geq d_B$ where $d_c$ is an atomic density of carbon in the p-type silicon carbide semiconductor, $d_{si}$ is an atomic density of silicon in the p-type silicon carbide semiconductor and $d_B$ is an atomic density of boron.

16. The process according to claim 15, wherein said introduction of carbon is controlled such that an atomic density distribution of the carbon in the p-type silicon carbide semiconductor in depth direction thereof is substantially the same as that of the boron.

* * * * *